United States Patent
Genik

(10) Patent No.: US 9,041,462 B2
(45) Date of Patent: May 26, 2015

(54) POWER AMPLIFIER WITH AN ADAPTIVE BIAS

(75) Inventors: Anatoly Genik, Kfar Saba (IL);
Svetlana Kantor, legal representative, Kfar-Saba (IL)

(73) Assignee: DSP GROUP LTD., Herzliya (IL)

( * ) Notice: Subject to any disclaimer, the term of this patent is extended or adjusted under 35 U.S.C. 154(b) by 87 days.

(21) Appl. No.: 13/882,507

(22) PCT Filed: Nov. 18, 2010

(86) PCT No.: PCT/IL2010/000967
§ 371 (c)(1),
(2), (4) Date: Apr. 30, 2013

(87) PCT Pub. No.: WO2012/066526
PCT Pub. Date: May 24, 2012

(65) Prior Publication Data
US 2013/0249634 A1  Sep. 26, 2013

(51) Int. Cl.
| H03G 3/20 | (2006.01) |
| H03G 3/00 | (2006.01) |
| H03F 1/02 | (2006.01) |
| H03F 1/30 | (2006.01) |
| H03F 3/193 | (2006.01) |
| H03F 3/24 | (2006.01) |

(52) U.S. Cl.
CPC .............. *H03G 3/004* (2013.01); *H03F 1/02* (2013.01); *H03F 1/301* (2013.01); *H03F 3/193* (2013.01); *H03F 3/245* (2013.01); *H03F 2200/18* (2013.01); *H03F 2200/451* (2013.01); *H03F 2200/78* (2013.01)

(58) Field of Classification Search
CPC ..................................................... H03G 3/3042
USPC .................................. 330/127, 297; 327/538
See application file for complete search history.

(56) References Cited

U.S. PATENT DOCUMENTS

| 2004/0056721 A1 | 3/2004 | LeSage |
| 2009/0195318 A1 | 8/2009 | Kang |

FOREIGN PATENT DOCUMENTS

| EP | 1855379 | 11/2007 |
| WO | 2008/041063 | 4/2008 |

*Primary Examiner* — Robert Pascal
*Assistant Examiner* — Khiem Nguyen
(74) *Attorney, Agent, or Firm* — Oren Reches

(57) ABSTRACT

An electronic circuit, including, a power amplifier adapted to amplify an RF signal and provide it as output from the integrated circuit; a power source that is adapted to provide an unregulated voltage to the power amplifier; a regulator adapted to provide a regulated bias voltage; a subtracter that is adapted to accept a voltage proportional to the unregulated voltage and subtract it from the bias voltage to provide a reference voltage to the power amplifier; wherein the power amplifier is adapted to use the reference voltage to adjust the output from the power amplifier so that it will provide a stable power output.

16 Claims, 2 Drawing Sheets

POWER AMPLIFIER WITH AN ADAPTIVE BIAS

RELATED APPLICATIONS

This application is a national phase under 35 U.S.C. 371 of PCT application number PCT/IL2010/000967 filed on Nov. 18, 2010 and published as WO 2012/066526 the disclosure of which is incorporated herein by reference.

FIELD OF THE INVENTION

The present invention relates generally to power amplifiers, and more specifically to a power amplifier with an adaptive bias that is adjusted to control the power output from the power amplifier.

BACKGROUND OF THE INVENTION

Many devices use power amplifiers to amplify a signal and provide it as output from the device. Typically, the power amplifier accepts power from a VCC source to perform amplification. The power output from the amplifier is generally proportional to the square of the VCC power ($VCC^2$). If the VCC power source is regulated the power output will be stable. However if the VCC power source is not regulated then the power output may fluctuate. A small change in the value of the VCC power source will lead to a large change in the power of the output signal, since it is proportional to the square of the power source.

In miniature devices and battery powered devices the addition of elements to regulate the power source is generally less feasible. In such devices the power output may fluctuate and may reach high values that can damage circuit elements (e.g. transistors or integrated circuits) or reduce their lifespan. Additionally, a high power output exceeding the original design may interfere with the functionality of other devices in the vicinity of the device and may cause the device to function against regulations (e.g. FCC standards). Likewise a low power output due to fluctuations may not provide enough power to enable recipients to receive the transmitted signal although they are in a pre-designated range from the transmitter.

There is thus a need to stabilize the power output of a power amplifier especially when the power source is unregulated. Standard solutions include additional elements coupled to the output of the power amplifier, for example an RF coupler or an RF power detector. The coupler or detector monitor the power output and provide feedback to the device to instruct it to reduce or increase the power provided to the power amplifier. However such solutions require additional elements external to the amplifying circuitry of the device and increase the cost of the device. It would be desirable to stabilize the power output of a device without a regulated power source by controlling the power consumption of the power amplifier from within the device.

SUMMARY OF THE INVENTION

An aspect of an embodiment of the invention, relates to an electronic circuit with a power amplifier, and to a method of controlling the power output to provide a stabilized power output from the power amplifier. In an exemplary embodiment of the invention, the circuit includes a power source that provides an unregulated voltage to the power amplifier. Additionally, the electronic circuit includes a regulator that is provided with power from the power source or from an external source. The regulator provides a regulated bias voltage. In an exemplary embodiment of the invention, a voltage proportional to the unregulated voltage is supplied to a subtracter and subtracted from the regulated bias voltage. The resulting voltage is provided as a reference to the power amplifier, so that the power amplifier can neutralize the fluctuations of the unregulated voltage and provide an amplified signal with a stable power output.

In some embodiments of the invention, the electronic circuit is powered from a single power source. Alternatively, the regulator may be provided power from a different power source. Optionally, the power source may draw power from one or more batteries to allow the circuit to be portable. Alternatively, the power source may draw power from an electronic socket, for example using a transformer.

In an exemplary embodiment of the invention, a voltage divider is used to extract the voltage proportional to the unregulated voltage. Optionally, the voltage divider includes two or more resistors in sequence. In some embodiments of the invention, the resistors are varying resistors, so that the voltage division is adjustable and the power output from the power amplifier is controlled by varying the resistance.

There is thus provided according to an exemplary embodiment of the invention, an electronic circuit, including:
a power amplifier adapted to amplify an RF signal and provide it as output from the integrated circuit;
a power source that is adapted to provide an unregulated voltage to the power amplifier;
a regulator adapted to provide a regulated bias voltage;
a subtracter that is adapted to accept a voltage proportional to the unregulated voltage and subtract it from the bias voltage to provide a reference voltage to the power amplifier;
wherein the power amplifier is adapted to use the reference voltage to adjust the output from the power amplifier so that it will provide a stable power output.

In an exemplary embodiment of the invention, the regulator accepts power from the power source that is adapted to provide an unregulated voltage to the power amplifier. Optionally, the regulator accepts power from a different power source. In an exemplary embodiment of the invention, the circuit includes a voltage divider to provide the voltage proportional to the voltage of the unregulated voltage. Optionally, the voltage divider includes two resistors in sequence. In an exemplary embodiment of the invention, the voltage divider is adjustable. Optionally, the power output of the integrated circuit is adjusted responsive to adjustment of the voltage divider.

In an exemplary embodiment of the invention, the power source is powered by one or more batteries. Optionally, the power source is powered from a standard power socket using a transformer.

There is further provided by an exemplary embodiment of the invention, a method of controlling the power output from a power amplifier, including:
supplying an unregulated voltage to the power amplifier from a power source;
providing a regulated bias voltage from a regulator;
forming a voltage proportional to the unregulated voltage;
subtracting the voltage proportional to the voltage of the unregulated voltage from the regulated bias voltage to form a reference voltage;
using the reference voltage to adjust the output from the power amplifier to provide a stable power output.

In an exemplary embodiment of the invention, the regulator receives power from the unregulated voltage provided to the power amplifier. Optionally, the regulator receives power from a different power source. In an exemplary embodiment of the invention, the voltage proportional to the unregulated voltage is extracted from a voltage divider. Optionally, the voltage divider is adjustable.

BRIEF DESCRIPTION OF THE DRAWINGS

The present invention will be understood and better appreciated from the following detailed description taken in conjunction with the drawings. Identical structures, elements or parts, which appear in more than one figure, are generally labeled with the same or similar number in all the figures in which they appear, wherein.

DETAILED DESCRIPTION

Figure 1:
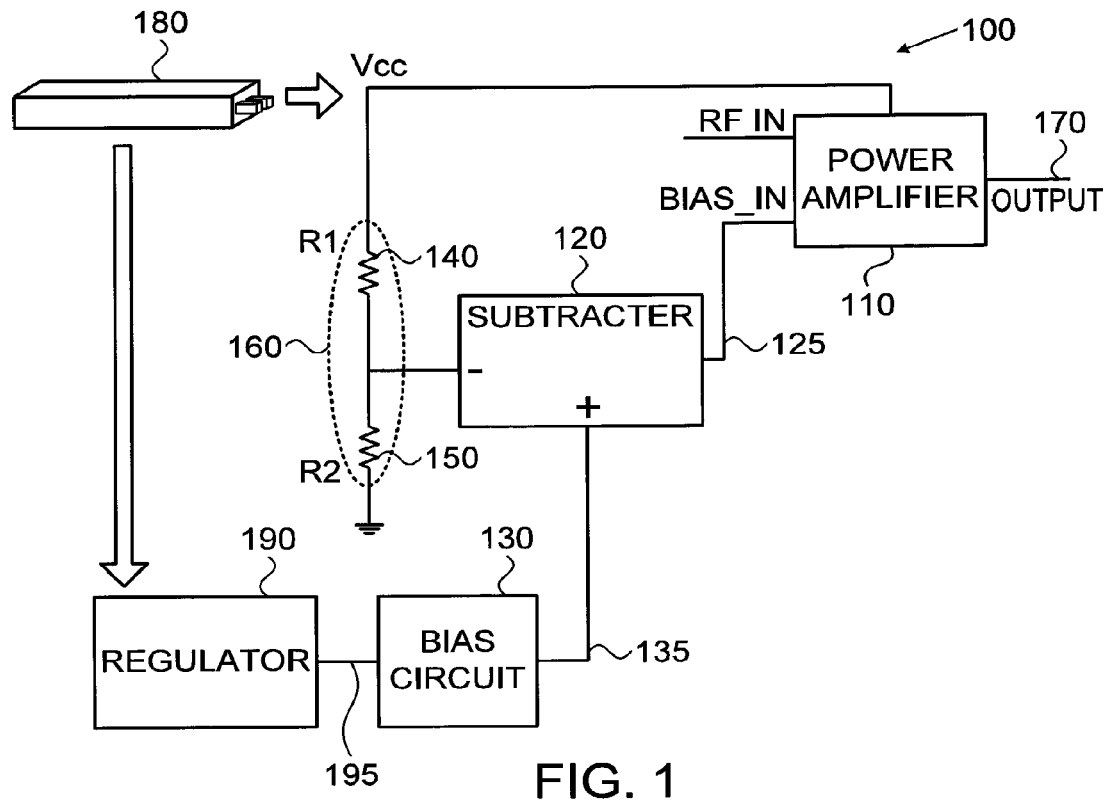
FIG. 1 is a schematic illustration of a device with a power amplifier, according to an exemplary embodiment of the invention.

FIG. 1 is a schematic illustration of a device 100 with a power amplifier 110, according to an exemplary embodiment of the invention. In an exemplary embodiment of the invention, device 100 is powered by a power source 180. Optionally, power source 180 is powered by batteries and may include one or more batteries. Alternatively, power source 180 may be powered by power provided from standard power outlets, for example via a transformer. In an exemplary embodiment of the invention, power source 180 provides unregulated power to serve as the VCC of device 100. Optionally, elements that require a lot of power such as the power amplifier 110 will be connected directly to the VCC. Additionally, power source 180 provides power to a regulator 190 to form a low current bias signal to be used to adjust the accuracy of the output from power amplifier 110.

In an exemplary embodiment of the invention, device 100 may be a wireless handheld telephone that transmits an RF signal to a base station or other types of devices that amplify a signal and provide it to an output 170. Optionally, output 170 may provide the output signal wirelessly or over a wire to an external device.

In an exemplary embodiment of the invention, power source 180 provides a voltage that may vary depending on various parameters, for example if power source 180 uses batteries it may provide a nominal voltage of 1.7V from each battery when the batteries are new or fully charged. Optionally, during use the nominal voltage may quickly deteriorate to a working range of 1.2V per battery and even further down to 0.9V per battery as the charge in the batteries is nearly depleted. Similarly voltage from a non-regulated transformer may vary depending on the power provided by the main power source that the power is drawn from.

In an exemplary embodiment of the invention, regulator 190 provides a low current regulated power signal 195, for example 1.8V from 2 batteries, to power internal circuit elements of device 100 with a stable power signal. Optionally, regulated power signal 195 is essentially stable regardless of the status of the power source 180 (e.g. new batteries or old batteries, or fully charged or half charged) as long as the power source 180 can provide the minimum power required by regulator 190.

In an exemplary embodiment of the invention, regulated power signal 195 is provided to a bias circuit 130. Optionally, bias circuit 130 derives a low voltage low current bias signal 135 (e.g. 0.7V) to serve as a reference to adjust the power output 170. In an exemplary embodiment of the invention, a subtracter 120 is used to generate a BIAS_IN signal 125 that represents the difference between the varying VCC and the stable bias signal 135. The BIAS_IN signal 125 is provided to power amplifier 110 to adjust power output 170. In an exemplary embodiment of the invention, the VCC signal from power source 180 is provided to a voltage divider 160 that comprises two resistors (R1 (140) and R2 (150)). Optionally, the values of the resistors are pre-selected so that when the VCC is at its optimal value the voltage on R2, which is then subtracted from bias signal 135 will generate BIAS_IN 125 so that the power output 170 will not be adjusted. If the VCC increases the voltage on R2 increases and BIAS_IN 125 is reduced by subtracter 120 causing the power output 170 to remain essentially constant although VCC increased. In contrast if VCC is reduced the voltage on R2 is reduced and BIAS_IN 125 increases causing the VCC to remain essentially constant although VCC was reduced.

In some embodiments of the invention, bias signal 135 may be provided from a different source than the VCC, for example from a different battery or from an external regulator.

Figure 2:
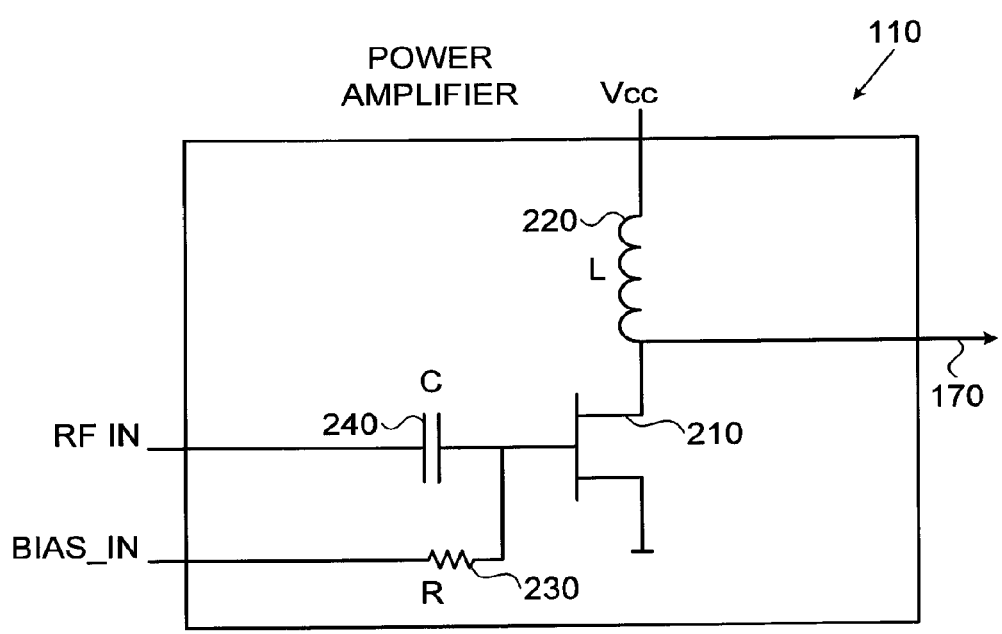
FIG. 2 is a schematic illustration of a power amplifier, according to an exemplary embodiment of the invention.

FIG. 2 is a schematic illustration of a power amplifier 110, according to an exemplary embodiment of the invention. In an exemplary embodiment of the invention, power amplifier 110 includes a transistor 210 to amplify an input signal (RF IN) and provide it as an amplified output signal 170. In an exemplary embodiment of the invention, the transistor gate is connected to the input signal (RF IN) with a capacitor 240 (RF IN is an AC signal). Optionally, the BIAS_IN signal 125 (a DC signal) is connected to the transistor gate with a resistor 230 in parallel to capacitor 240. Optionally, the drain of transistor 210 serves as power output 170 and is connected to VCC through an inductor 220 (e.g. a coil).

Figure 3:
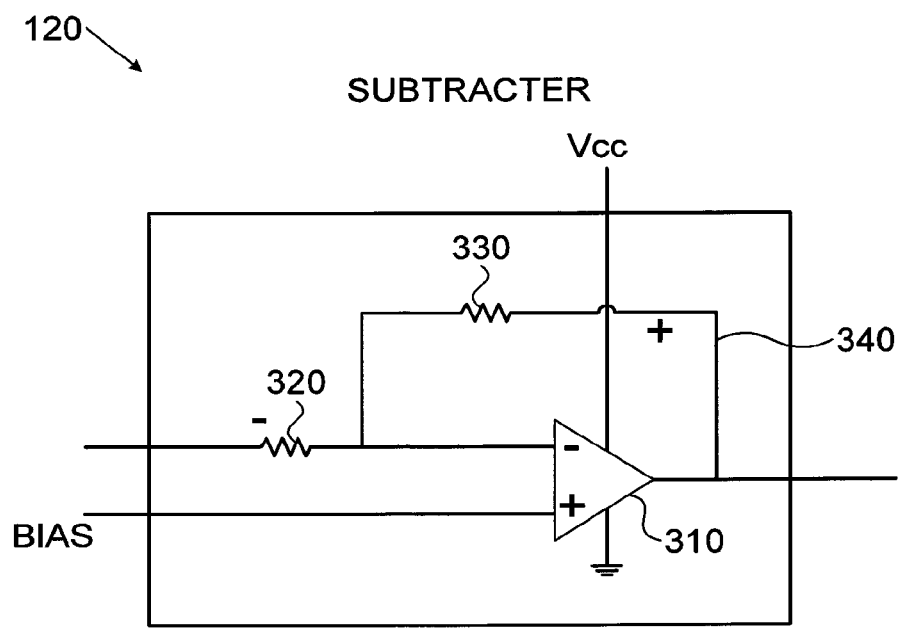
FIG. 3 is a schematic illustration of a subtracter, according to an exemplary embodiment of the invention.

FIG. 3 is a schematic illustration of subtracter 120, according to an exemplary embodiment of the invention. In an exemplary embodiment of the invention, subtracter 120 includes an operational amplifier 310 with a feedback line 340 between the output of the subtracter 120 and the input from the power source 180 through voltage divider 160. Optionally, various resistors (e.g. 320 and 330) are used to tune subtracter 120, so that the output from power amplifier 170 will be optimal.

Figure 4:
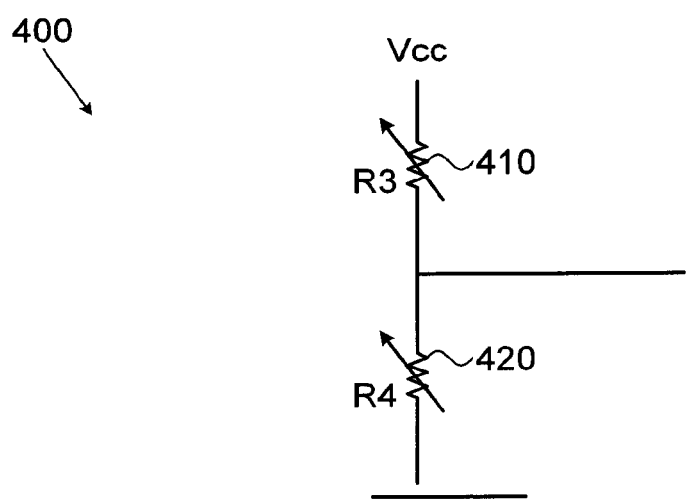
FIG. 4 is a schematic illustration of an alternative voltage divider, according to an exemplary embodiment of the invention.

FIG. 4 is a schematic illustration of an alternative voltage divider 400, according to an exemplary embodiment of the invention. In some embodiments of the invention, a varying voltage divider 400 is used instead voltage divider 160 that uses non-varying resistors (140, 150). Varying voltage divider 400 allows control of resistors R3 (410) and R4 (420) to select various modes of operation of device 100, for example so that a user can increase or reduce the power output.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the invention. Further combinations of the above features are also considered to be within the scope of some embodiments of the invention.

It will be appreciated by persons skilled in the art that the present invention is not limited to what has been particularly shown and described hereinabove. Rather the scope of the present invention is defined only by the claims, which follow.

What is claimed is:

1. An electronic circuit, comprising: a power amplifier adapted to amplify an RF signal and provide it as output from the electronic circuit; a power source that is adapted to provide an unregulated voltage to the power amplifier; a regulator adapted to provide a regulated bias voltage; a subtracter that is adapted to accept a voltage proportional to the unregulated voltage and subtract it from the bias voltage to provide a reference voltage to the power amplifier; wherein said power amplifier is adapted to use the reference voltage to adjust the output from the power amplifier so that it will provide a stable power output.

2. The electronic circuit according to claim 1, wherein said regulator accepts power from the power source that is adapted to provide the unregulated voltage to the power amplifier.

3. The electronic circuit according to claim 1, wherein said regulator accepts power from a different power source.

4. The electronic circuit according to claim 1, further comprising a voltage divider to provide the voltage proportional to the unregulated voltage.

5. The electronic circuit according to claim 4, wherein said voltage divider comprises two resistors in sequence.

6. The electronic circuit according to claim 4, wherein said voltage divider is adjustable.

7. The electronic circuit according to claim 6, wherein the power output of said electronic circuit is adjusted responsive to adjustment of the voltage divider.

8. The electronic circuit according to claim 1, wherein said power source is powered by one or more batteries.

9. A method of controlling an output from a power amplifier, comprising: supplying an unregulated voltage to the power amplifier from a power source; providing a regulated bias voltage from a regulator; forming a voltage proportional to the unregulated voltage; subtracting the voltage proportional to the unregulated voltage from the regulated bias voltage to form a reference voltage; using the reference voltage to adjust the output from the power amplifier to provide a stable power output.

10. The method according to claim 9, wherein said regulator receives power from the unregulated voltage provided to the power amplifier.

11. The method according to claim 9, wherein said regulator receives power from a different power source.

12. The method according to claim 9, wherein the voltage proportional to the unregulated voltage is extracted from a voltage divider.

13. The method according to claim 12, wherein the voltage divider is adjustable.

14. The electronic circuit according to claim 12, wherein said voltage divider comprises two resistors in sequence.

15. The method according to claim 13, wherein the power output of said electrical circuit is adjusted responsive to adjustment of the voltage divider.

16. The method according to claim 9, wherein, wherein said power source is powered by one or more batteries.

* * * * *